(12) United States Patent
Fowler

(10) Patent No.: US 6,218,831 B1
(45) Date of Patent: Apr. 17, 2001

(54) LOW POWER FLUXGATE CIRCUIT WITH CURRENT BALANCE

(75) Inventor: J. Thomas Fowler, Marblehead, MA (US)

(73) Assignee: Arthur D. Little, Inc., Cambridge, MA (US)

( * ) Notice: Subject to any disclaimer, the term of this patent is extended or adjusted under 35 U.S.C. 154(b) by 0 days.

(21) Appl. No.: 09/314,322

(22) Filed: May 19, 1999

(51) Int. Cl.[7] .......................... G01R 33/04; G01R 33/02; H03K 17/00
(52) U.S. Cl. .......................... 324/253; 324/228; 324/258; 33/361; 340/870.33; 361/156
(58) Field of Search .................................... 324/228, 234, 324/239, 244, 249, 253–255, 258, 260; 33/361; 340/870.33; 361/155, 156

(56) References Cited

U.S. PATENT DOCUMENTS

| 3,605,011 | 9/1971 | Hart et al. .......................... 324/43 R |
| 3,824,456 | 7/1974 | Wiegand . |
| 4,088,954 | 5/1978 | Fletcher et al. . |
| 4,157,579 | * 6/1979 | Paul . |
| 4,293,815 | 10/1981 | West et al. . |
| 4,384,254 | 5/1983 | Brown . |
| 4,410,926 | * 10/1983 | Hafner et al. .................... 361/156 X |
| 4,859,944 | 8/1989 | Webb . |
| 4,868,504 | * 9/1989 | Johnson ......................... 324/239 X |
| 5,115,197 | 5/1992 | Brandolino et al. . |
| 5,124,648 | 6/1992 | Webb et al. . |
| 5,170,566 | 12/1992 | Fowler et al. . |
| 5,525,907 | * 6/1996 | Frazier ............................ 324/239 X |
| 5,560,115 | 10/1996 | Fowler . |
| 5,670,877 | 9/1997 | Scheiber . |
| 5,744,956 | * 4/1998 | Hawks ............................... 324/253 |
| 5,757,184 | * 5/1998 | Kurihara et al. ................. 324/258 X |
| 5,764,052 | * 6/1998 | Renger ........................... 324/253 X |
| 6,014,025 | 1/2000 | Cripe .................................. 324/253 |

FOREIGN PATENT DOCUMENTS

WO 99/44072   9/1999   (WO) .

* cited by examiner

Primary Examiner—Gerard R. Strecker
(74) Attorney, Agent, or Firm—McDermott, Will & Emery

(57) ABSTRACT

The present invention is a system for cyclically driving an electrical current through at least one non-linear (i.e., saturable) inductor in alternating directions so as to produce a substantially periodic current waveform, and for producing an output signal representative of the current waveform. The system includes at least one capacitive node electrically coupled between a voltage source and a system ground, for storing electrical energy provided by the voltages source. The energy stored within the system is transferred as electrical current in alternating directions through the inductor via a switching network and a controller for configuring the switching network. The controller allows current to flow in each direction until the inductor saturates. The system further includes a signal processor that determines a first time interval and a second time interval related to the amount of time that the current flows through the inductor in a first direction and a second direction, respectively, and produces an output signal that is a predetermined function of the first time interval and the second time interval. The system requires a small amount of input current compared to similar prior art circuits because the inductor current is re-circulated within the system, and input current from an external source is only necessary to replace losses such as $I^2R$ dissipation.

17 Claims, 8 Drawing Sheets

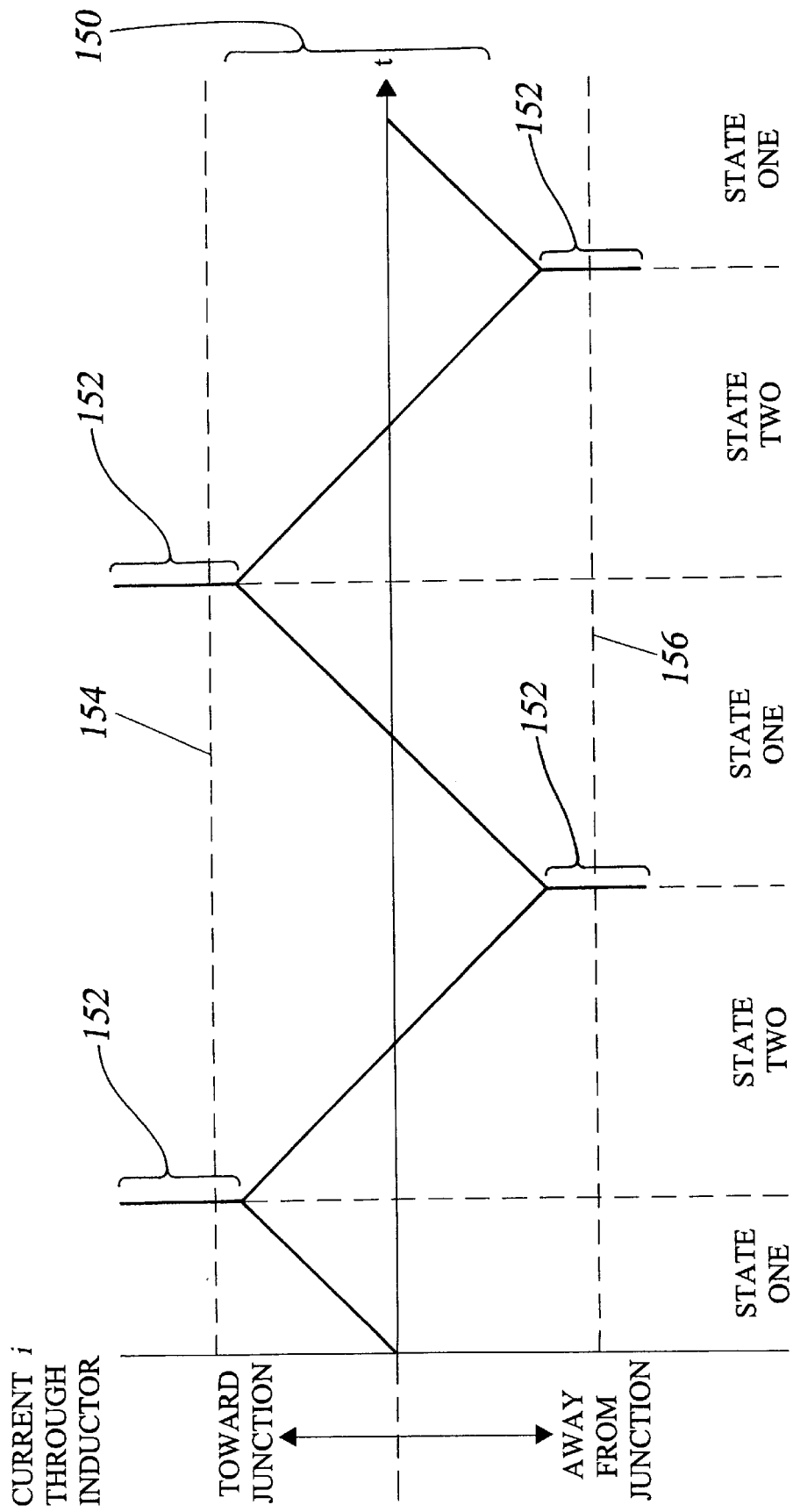

LOW POWER FLUXGATE CIRCUIT WITH CURRENT BALANCE

CROSS-REFERENCE TO RELATED APPLICATIONS

This application is related to the following U.S. application filed contemporaneously herewith, of common assignee, the contents of which are incorporated herein in their entirety by reference:

"Position Encoder Utilizing Fluxgate Sensors," invented by J. Thomas Fowler U.S. patent application Ser. No. 09/315,205.

STATEMENT REGARDING FEDERALLY SPONSORED RESEARCH

Not Applicable.

REFERENCE TO MICROFICHE APPENDIX

Not Applicable

FIELD OF THE INVENTION

The present invention relates to oscillating driver circuits, and more particularly to oscillating driver circuits for driving inductive components, such as magnetic fluxgate sensors within position encoders.

BACKGROUND OF THE INVENTION

In general, position encoders are devices which determine the instantaneous physical position of a movable object with respect to a fixed reference point, and translate such position information into a form that can be utilized by a processing, analytical or other type, tool. A position encoder typically transforms position information into an electrical signal, and provides the electrical signal to an analog or digital signal processor. Position encoders may determine angular position, as in the case of a rotatable shaft or toroidal structure (e.g., an automobile tire), or they may determine linear position, as in the case of a slidable control actuator. An ideal position encoder produces an output signal that is a linear function of the position of the movable object. An improved position encoder is described and claimed in my copending application, U.S. patent application Ser. No. 09/315,205, filed contemporaneously herewith, and assigned to the present assignee (Attorney Docket No. ADL-091). Instantaneous position information, sampled over time, may be used to determine higher derivatives of position such as velocity and acceleration.

Typical position encoders operate either mechanically, optically or magnetically. A mechanical encoder relies upon physical contact with the movable object; actuators on the movable object physically interact with an electromechanical transducer to produce an electrical signal. An optical encoder receives light reflected from illuminated markings associated with the movable object and translates variations in the received light into an electrical signal. Magnetic encoders typically utilize either fluxgate sensors or Hall effect sensors. A fluxgate sensor magnetic encoder uses fluxgate sensors to detect the magnetic field generated by magnetic elements attached to the movable object, and translates aspects of the magnetic field such as magnitude and direction into an electrical signal corresponding to the position of the object. A Hall effect sensor magnetic encoder translates the Hall effect of a magnetic field on a current carrying conductor to produce a signal corresponding to the position of the object. Fluxgate position encoders are several orders of magnitude more sensitive than Hall effect position encoders and are thus preferred in applications where it may be difficult to have the sensors in close proximity of the magnetic element producing the magnetic field. For example, in an application to determine the angular position of an automobile tire, the close proximity a Hall effect sensor requires is difficult to maintain because of the harsh environment created by road dirt, oil, grease, ice and snow.

A fluxgate sensor includes one or more turns of an electrical conductor wound about a core, which is disposed along a sensing axis. The core may be any material, including air, although high permeability materials such as iron or nickel are usually preferred. An external driving circuit alternately drives the sensor into saturation in one polarity and then into the opposite polarity. The external driving circuit drives current through the windings in one direction until the core saturates. Once the core saturates, the driving circuit reverses current in the windings until the core saturates in the opposite polarity. In the absence of an external magnetic field, the amount of time the driving circuit drives current in each direction is the same; i.e., the current waveform through the windings as a function of time is symmetrical. The presence of an external magnetic field "helps" (i.e., enhances) the saturation of the core in one polarity, while the external magnetic field impedes the saturation of the core in the opposite polarity. Thus, in the presence of an external magnetic field, the waveform of the current through the windings as a function of time is asymmetrical, since saturation occurs more quickly for the polarity of the saturation enhanced by the external field. The amount of asymmetry may be used to determine characteristics of the external magnetic field, such as magnitude and direction.

The amount of current necessary to drive an inductor coil into saturation varies with the number of windings, the core material, etc. However, for a typical flux gate sensor, the amount of current necessary to drive the sensor into saturation will be on the order of tens of mA. Since this current is entirely supplied by the driver circuit, the input power requirements of such a driver circuit are defined by the saturation current of the fluxgate sensor. For example, U.S. Pat. No. 4,859,944, "Single Winding Magnetometer With Oscillator Duty Cycle Measurement," invented by Spencer L. Webb, discloses a driver circuit which essentially alternately connects a positive voltage source and a negative voltage source across an inductor coil. A few tens of mA is not generally considered a large amount of current. However, in low power applications, such as portable electronic systems which operate from a battery power source, current requirement goals are typically in the micro-ampere range.

It is an object of this invention to provide a position encoder that substantially overcomes or reduces the aforementioned disadvantages while providing other advantages which will be evident hereinafter.

SUMMARY OF THE INVENTION

The present invention is a system for cyclically driving an electrical current through an inductor in alternating directions so as to produce a substantially periodic current waveform, and for producing an output signal representative of the current waveform. In one aspect of the invention, the output signal corresponds to the strength of an external magnetic field in the presence of the inductive component. The system includes a first capacitor and a second capacitor electrically coupled in series. The first capacitor is coupled between a voltage source and a junction node, and the second capacitor is coupled between the junction node and a system ground. A first terminal of the inductor is electrically coupled to the junction node, and the junction node has an associated junction voltage. The system further includes a switching network for alternately interconnecting the first capacitor, the second capacitor and the inductor in a first state and a second state. The first state is characterized by the inductor and the first capacitor being electrically coupled in parallel, and the second state is characterized by the inductor and the second capacitor being electrically coupled in parallel. The system also includes a controller for configuring the switching network to the first state for a first time interval until the inductor saturates, thereupon configuring the switching network to the second state for a second time interval until the inductor saturates, such that the switching network cyclically alternates between the first state and the second state. The system further includes a signal processor with an input terminal that is electrically coupled to the junction so as to receive the junction voltage. The signal processor also has an output terminal that produces the output signal. The output signal is a function of the first time interval and the second time interval.

In another embodiment, the inductor includes at least one flux gate sensor.

In another embodiment, the inductor includes at least two fluxgate sensors electrically coupled in series opposition.

In yet another embodiment, the switching network includes a digital driver having a totem-pole output architecture electrically coupled between the voltage source and the system ground.

In another embodiment, the system further includes a current source having an output terminal electrically coupled to the junction and providing a feedback current to the junction, the feedback current having a magnitude being a function of the output signal.

In another embodiment, the controller further includes a sense element for sensing the inductor current so as to produce a current sense signal representative of the current magnitude, a comparator for comparing the current sense signal to a first saturation value while the inductor current flows in a first direction, and for comparing the current sense signal to a second saturation value while the electrical current flows in a second direction opposite to the first direction.

BRIEF DESCRIPTION OF THE DRAWINGS

The foregoing and other objects of this invention, the various features thereof, as well as the invention itself, may be more fully understood from the following description, when read together with the accompanying drawings in which:

FIG. 3 shows a graphical representation of the current through-the inductor of the oscillating driver circuit of FIG. 1 in the absence of an external magnetic field;

DETAILED DESCRIPTION OF THE INVENTION

Figure 1:
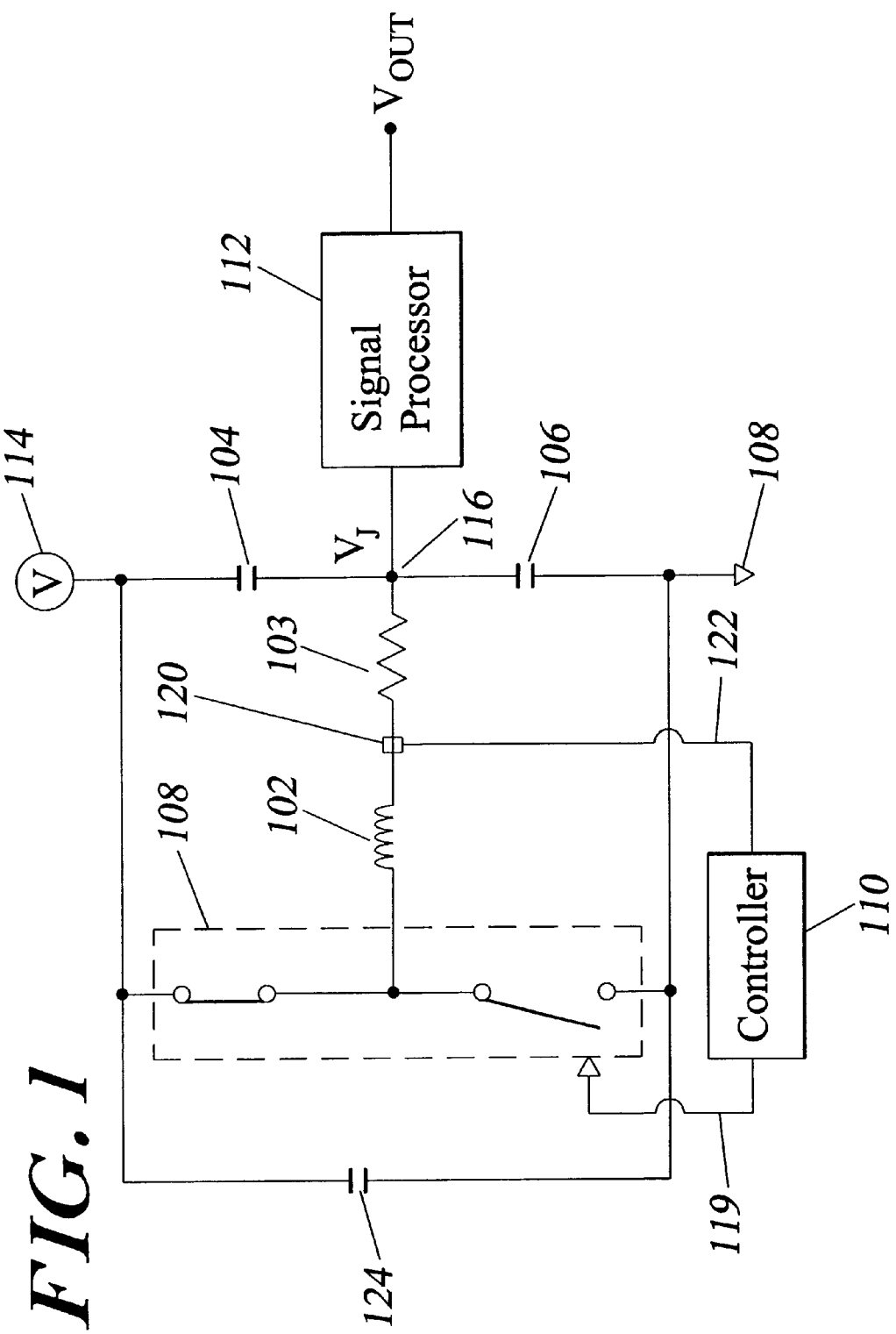
FIG. 1 illustrates a schematic view of one preferred embodiment of an improved oscillating driver circuit according to the present invention.

The invention is directed to an improved oscillating driver circuit for cyclically driving current through non-linear (i.e., saturable) inductive components such as magnetic fluxgate sensors. FIG. 1 illustrates a schematic view of one preferred embodiment of an improved oscillating driver circuit according to the present invention, including an inductor 102, a resistor 103, a first capacitor 104, a second capacitor 106, a switching network 108, a controller 110 and a signal processor 112. The first capacitor 104 and the second capacitor 106 are electrically coupled in series, such that the first capacitor 104 is electrically coupled between a voltage source 114 of V volts and a junction node 116, and the second capacitor 106 is electrically coupled between the junction node 116 and system ground 118. The inductor 102 is electrically coupled in series with the resistor 103, and the inductor/resistor pair is electrically coupled between the junction node 116 and the switching network 108. The junction node 116 is also electrically coupled to an input of the signal processor 112. The signal processor 112 thus receives the voltage $V_J$ that exists at junction node 116 and produces an output signal $V_{OUT}$ corresponding to some function of $V_J$. In one preferred embodiment, the output signal $V_{OUT}$ corresponds to a time-average of the junction voltage $V_J$ over some predetermined time interval, and then linearly scaled by a constant scaling factor and/or offset by a constant bias value.

The function performed by the first capacitor 104 and the second capacitor 106 may be performed in other embodiments by a single capacitive node capable of storing energy. In general, the capacitive node provides a location that may be alternately filled and emptied of energy, such that the transferred energy passes through the non-linear inductor as electrical current.

Figure 2A:
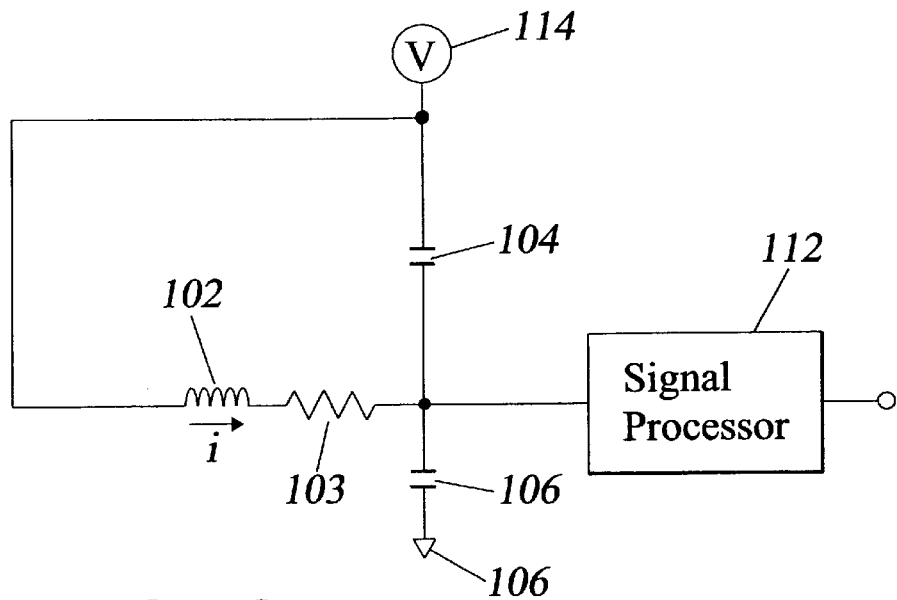
FIG. 2A illustrates a first state of the oscillating driver circuit of FIG. 1.
Figure 2B:
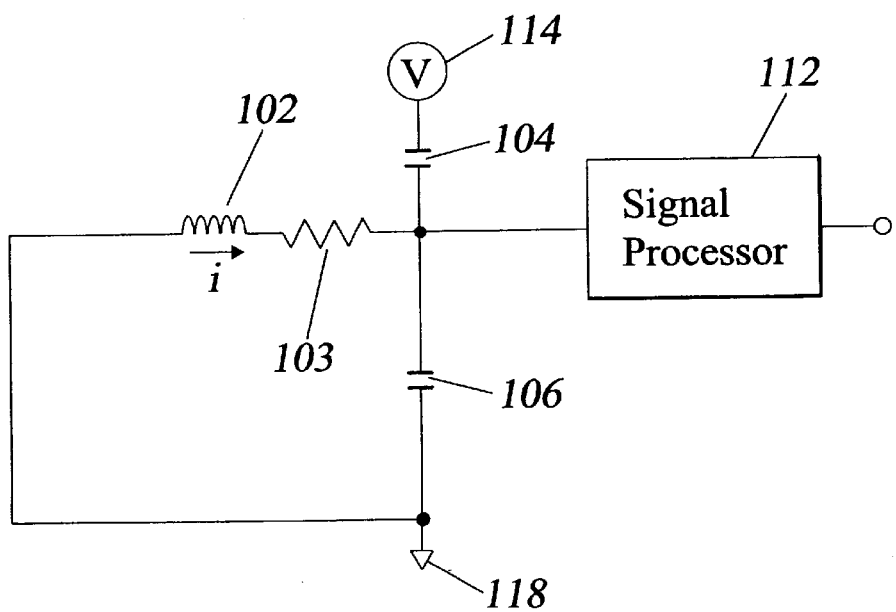
FIG. 2B illustrates a second state of the oscillating driver circuit of FIG. 1.

The switching network 108 is operative to cyclically interconnect the inductive component 102, the first capacitor 104 and the second capacitor 106 so as to alternately produce one of two states. In the first state, shown explicitly in FIG. 2A, the inductor 102 and the first capacitor 104 are electrically coupled in parallel. In the second state, shown explicitly in FIG. 2B, the inductor 102 and the second capacitor 106 are electrically coupled in parallel. The controller 110 provides an actuating input 119 to the switching network 108 and causes the switching network 108 to alternate between the first state and the second state. The actuating input 119 from the controller 110 to the switching network 108 is dependent upon the magnitude and direction of the current through the inductor 102. In the first state, as long as the inductor 102 operates in its linear region (i.e., it is not saturated), the inductor current I increases linearly, as shown by region 150 of FIG. 3, because the voltage across the inductor 102 is substantially constant. Note that in FIG. 3, current toward the junction node 116 is depicted as positive and current flowing away from the junction node 116 is depicted as negative. The linear increase in the current I is due to the $$v_l = L\frac{di_l}{dt}$$

relationship between the voltage $v_I$ across an inductor, and the current $i_I$ through the inductor, while the inductor operates in its linear region. In the first state, the inductor current I flows through the inductor 102 towards the junction node 116. As the current I increases, the magnetic field intensity increases, eventually causing the inductor core material to saturate. When the inductor 102 saturates, the current no longer increases linearly and "spikes," i.e., increases rapidly as shown by region 152 of FIG. 3, even though the voltage across the inductor 102/resistor 103 pair is still substantially constant. Thus, the behavior of the current I is indicative of whether or not the inductor 102 has saturated. The controller 110 monitors the inductor current I via sensor 120, which is electrically coupled to the controller 110 from sensor path 122. The controller 110 maintains the switching network 108 in the first state until the inductor current I, measured via sensor 120, exceeds a first saturation threshold value 154. When the controller 110 detects that the inductor current I exceeds the first threshold value 154, the controller 110 changes the state of the switching network 108 from the first state to the second state. In the second state, the voltage across the inductor 102 is substantially opposite in polarity than that of the first state; consequently, the inductor 102 ceases to be saturated and the current I begins to decrease linearly at a relatively constant rate as shown in FIG. 3. Eventually, as the current I continues to decrease, the current I reverses direction and flows away from the junction node 116 as shown in FIG. 2b. The current I subsequently increases linearly in magnitude, but in a direction away from the junction node 116 until the inductor current I (measured via sensor 120) exceeds a second threshold value 156. When the controller 110 detects that the inductor current I exceeds the second threshold value 156, the controller 110 changes the state of the switching network 108 from the second state to the first state. As the voltage across the inductor 102 again switches polarity, the inductor 102 ceases to be saturated and the magnitude of the current I again begins to decrease as shown in FIG. 3, and the cycle repeats.

Figure 4:
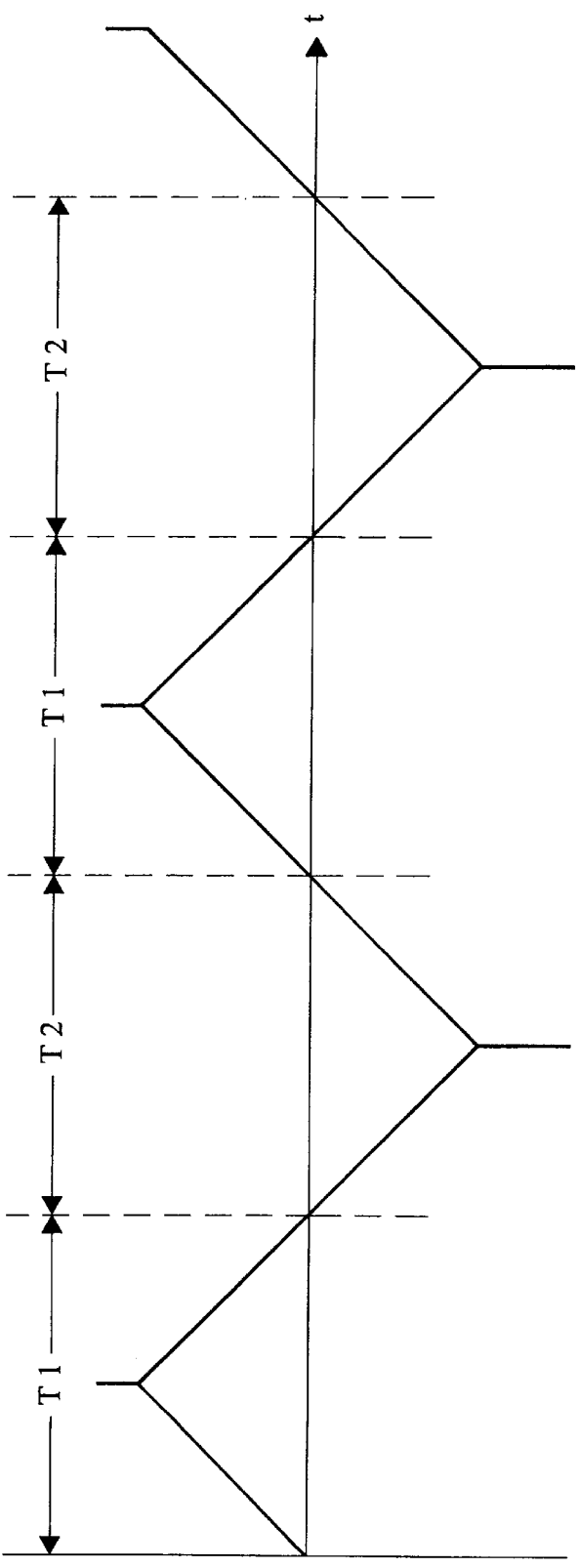
FIG. 4 shows a graphical representation of the current through the inductor of the oscillating driver circuit of FIG. 1 in the presence of an external magnetic field.

In the absence of an external magnetic field, the current waveform shown in FIG. 3 will be symmetrical about the horizontal axis, provided the core material of the inductor 102 is magnetically "soft", i.e., exhibits low residual flux ($B_r$). Such a material thus does not make a good permanent magnet. Ideally, the material will exhibit low coercivity and high permeability. However, in the presence of an external magnetic field, the component of the external field in the direction of the magnetic field induced by the inductor current I enhances the saturating of the inductor core in one direction and impedes saturation in the other direction. This "magnetic bias" causes an asymmetry in the inductor current waveform of FIG. 3 about the horizontal axis. FIG. 4 illustrates such an asymmetry corresponding to an external field enhancing saturation of the core from current flowing in the direction of the junction node 116. During each cycle, the amount of time T1 that the current flows through the inductor 102 toward the junction node 116 is less than the time T2 that the current I flows away from the junction node 116.

Because the voltage V across the two capacitors 104 and 106 is constant (i.e., the potential of voltage source 114 with respect to system ground 118), the current I flowing through the inductor 102 represents a transfer of energy from one of the capacitors (104 or 106) to the other. This is true because otherwise, if the current I originated from an external source, energy would be added to the pair of capacitors, and the overall voltage across them would increase. In one embodiment of the invention, shown in FIG. 1, an additional capacitor 124 is included across the series connected pair of capacitors 104 and 106 to provide a low impedance source of current to the circuit and to maintain and reinforce the constant voltage at the voltage source 114 with respect to system ground 118. One capacitor (104 or 106) functions as a current source and the other capacitor functions as a current sink, thus the voltage V, at junction node 116 must vary as the current is exchanged. This is because of the $$i_c = C\frac{dv_c}{dt}$$

relationship between the current $i_c$ into (or out of) a capacitor and the voltage $v_c$ across the capacitor. If the inductor current waveform of FIG. 3 is symmetric about the horizontal axis, then the time-average voltage $\overline{V}_J$ measured at junction node 116 remains at {(voltage source)−(system ground)}/2, or more simply at V/2, assuming that voltage source 114 is at V volts and system ground 118 is zero volts. If the inductor current waveform is asymmetric about the horizontal axis as shown in FIG. 4, then the time-average voltage $\overline{V}_J$ measured at junction node 116 will be offset somewhat from V/2, either towards V or towards system ground.

The junction node 116 is electrically coupled to an input of the signal processor 112 such that the signal processor receives the voltage $V_J$ present at junction node 116. In one preferred embodiment of the invention, the signal processor 112 determines the time-average $\overline{V}_J$ of the junction node voltage $V_J$ and then scales $\overline{V}^J$ to produce $V_{OUT}$.

Figure 5A:
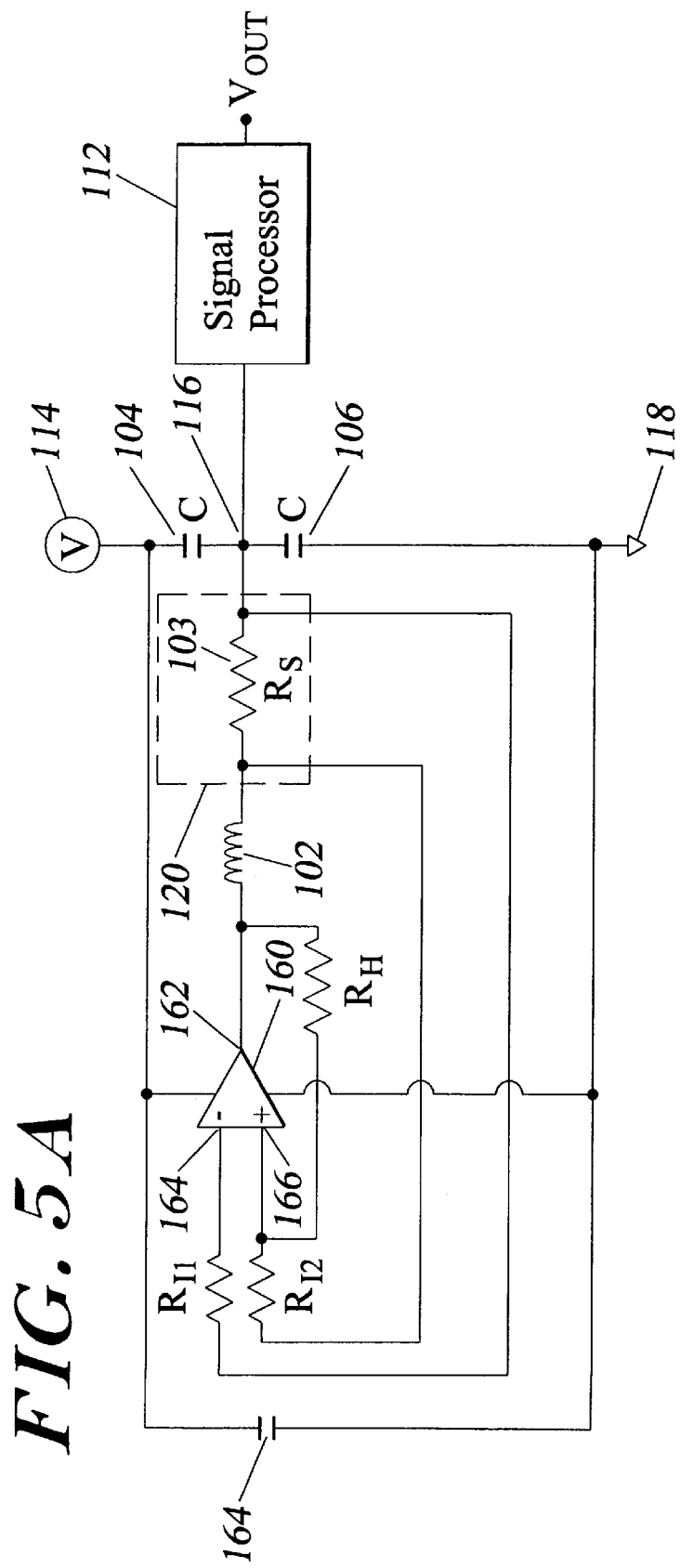
FIG. 5A shows a more detailed representation the oscillating driver circuit of FIG. 1.
Figure 6:
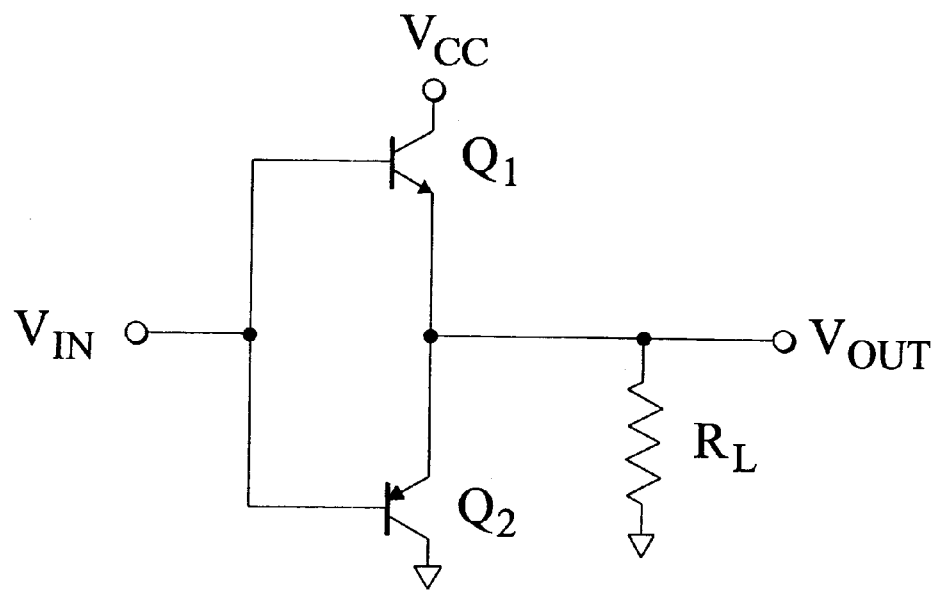
FIG. 6 illustrates the "totem-pole" output structure of a complementary emitter-follower output stage from the prior art.

In one preferred embodiment shown in FIG. 5A, the sensor 120 includes a sense resistor $R_S$ electrically coupled in series between the inductor 102 and the junction node 116. $R_S$ should be as low as is practical to reduce losses in the circuit. The switching network 108 and the controller 110 are combined to include a comparator 160, a first input resistor $R_{I1}$, a second input resistor $R_{I2}$, and a hysteresis resistor $R_H$. The comparator 160 includes an output terminal 162, an inverting input terminal 164 and a non-inverting input terminal 166. The comparator 160 should exhibit fast switching characteristics and low propagation time. Such comparators are well known to those in the art and are readily available commercially. For example, one preferred embodiment of the invention includes the MAX942 comparator, manufactured by Maxim Integrated Products, Sunnyvale, Calif. In a preferred embodiment, the output of the comparator 160 is a low impedance buffer that switches between the voltage source 114 and system ground 118, so as to accomplish the switching function of the switching network 108. Thus, the comparator may exist in one of two states as defined for the switching network 108. For example, FIG. 6 illustrates the bipolar "totem-pole" output structure of a complementary emitter-follower output stage, which is one prior art architecture that may be used to accomplish the specified switching function of the switching network 108. In a complementary emitter-follower output stage, either the top transistor Q1 is conducting while the bottom transistor Q2 is an open circuit, or the bottom transistor Q2 is conducting while the top transistor Q1 is an open circuit, depending upon the state of the input $V_I$. This is essentially the functionality depicted for the switching network 108 in FIG. 1.

In one preferred embodiment, the output structure may include complementary MOSFET components rather than the bipolar components shown in FIG. 6. The saturation voltages associated with bipolar components may introduce bias errors that MOSFET architectures do not exhibit.

As shown in FIG. 5A, the inductor current passes through the sense resistor $R_S$, indicated at 103, and thus produces a sense voltage $V_S$ across the sense resistor $R_S$. In order to reduce $I^2R$ losses, the value of $R_S$ should be relatively small; in one preferred embodiment $R_S$ includes a 10 ohm resistor, although other low resistance values of $R_S$ may also be used. The comparator 160 receives the sense voltage $V_S$ through input resistors $R_{I1}$ and $R_{I2}$, which are both resistors with relatively large values so as to match the high input impedance of the comparator 160. In a preferred embodiment of the invention, the input resistors $R_{I1}$ and $R_{I2}$ both include 10,000 ohm resistors, although other high resistance values may also be used. The hysteresis resistor $R_H$ is electrically coupled between the output 162 of the comparator 160 and the non-inverting input 166 of the comparator 160, so as to provide feedback from the output to the input of the comparator 160. The effect of this feedback is to produce one of two threshold levels (corresponding to either the first threshold value 154 or the second threshold value 156 of FIG. 3), dependent upon the state of the comparator output 162, with which to compare the sense voltage $V_S$. When the comparator is in the first state, i.e., when the current is flowing toward the junction node 116, the threshold used by the comparator 160 corresponds to the first threshold value 154. When the comparator is in the second state, the threshold used by the comparator 160 corresponds to the second threshold value 156.

Figure 5B:
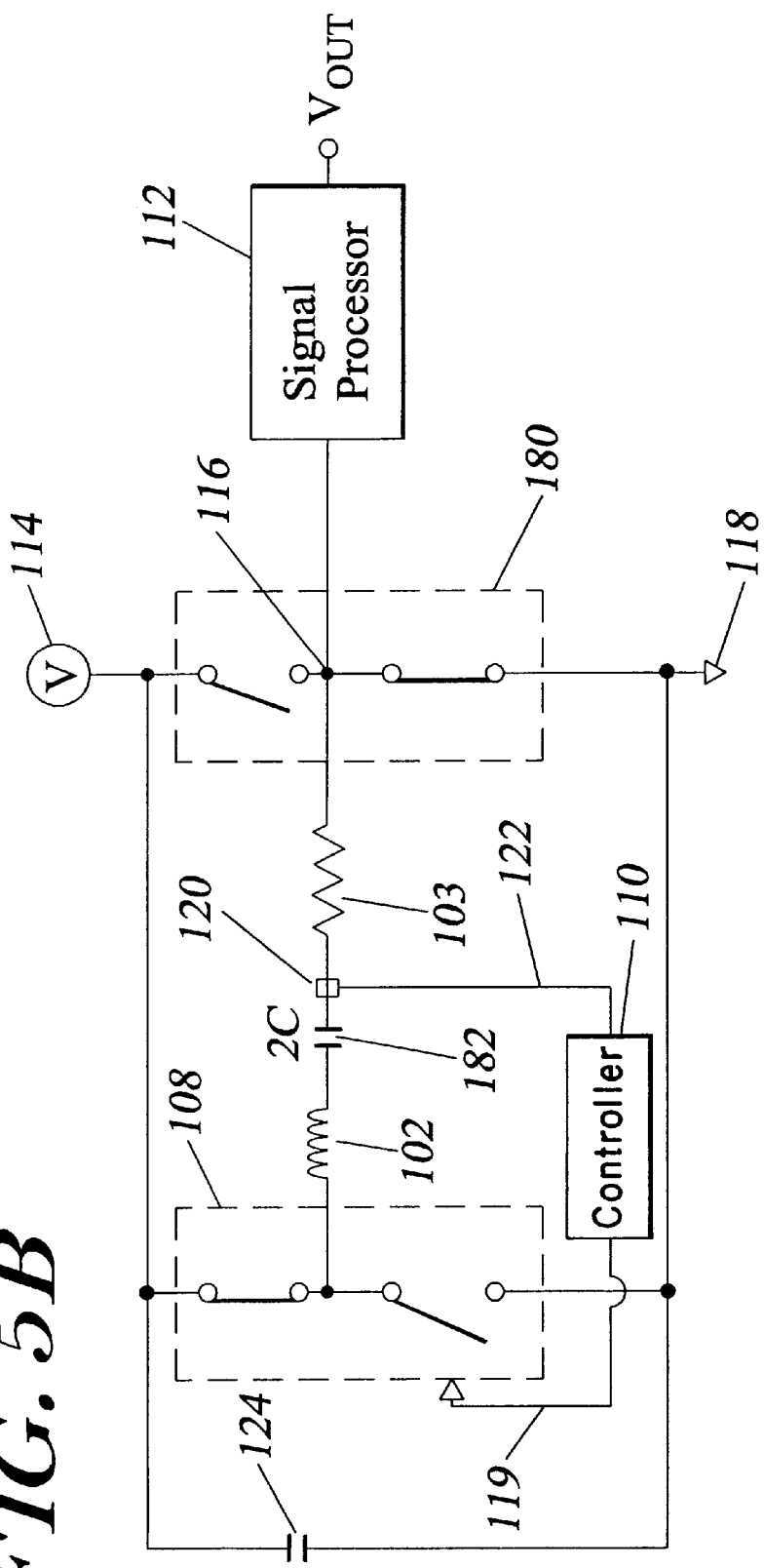
FIG. 5B shows an alternate embodiment of the circuit of FIG. 5A.

FIG. 5A is an example of a series half-bridge version of the present invention. FIG. 5B is a simplified example of a full bridge (i.e., voltage doubler) embodiment of the present invention, which includes a second switching network 180 that works with the first switching network 108 to alternate the voltage polarity applied across the inductor 102 and a single capacitor 182. The value of the single capacitor 182 in FIG. 5B is twice the value of each of the capacitors in FIG. 5A.

Figure 7:
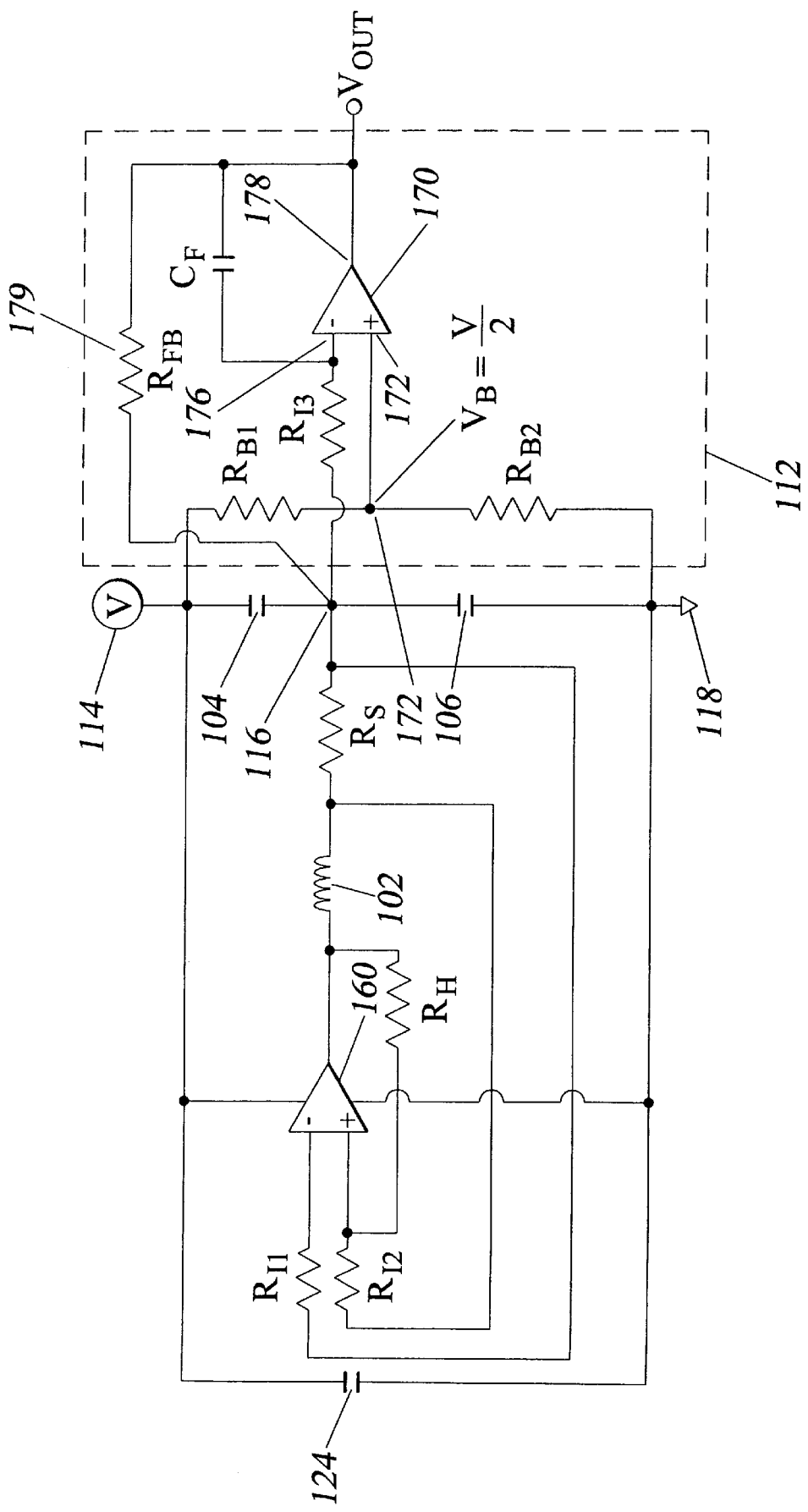
FIG. 7 shows a more detailed representation the oscillating driver circuit of FIG. 5.

In a preferred embodiment shown in FIG. 7, the signal processor 112 includes the constituent components of a first bridge resistor $R_{B1}$, a second bridge resistor $R_{B2}$, an input resistor $R_{I3}$, an operational amplifier 170, and a feedback capacitor $C_F$. The operational amplifier 170 includes a non-inverting input terminal 174, an inverting input terminal 176 and an output terminal 178. The feedback capacitor $C_F$ is electrically coupled between the output terminal 178 and the inverting input terminal 176. The input resistor $R_{I3}$ is electrically coupled between the junction node 116 and the inverting input terminal 176. The first and second bridge resistors $R_{B1}$ and $R_{B2}$ are electrically coupled in series between the voltage source 114 and the system ground 118, so as to form a resistive voltage divider. The voltage $V_B$ at the bridge junction node 172 between the two resistors $R_{B1}$ and $R_{B2}$ is well known to be $$V_B = V\left(\frac{R_{B2}}{R_{B1} + R_{B2}}\right),$$

where V is the voltage across the series connected bridge resistors (i.e., assuming that voltage source 114 is at V volts and system ground 118 is zero volts). The bridge resistors $R_{B1}$ and $R_{B2}$ are preferably equal in value so that the voltage $V_B$ at the bridge junction node 172 is one half of the voltage across the bridge resistors, i.e., $V_B=V/2$. The bridge junction node 172 is electrically coupled to the non-inverting input terminal 174 of the operational amplifier 170. $R_{B1}$ and $R_{B2}$ establish a reference voltage $V_B$ which functions as a virtual ground within the signal processor 112. It is well known in the art that the configuration of the operational amplifier 170, the feedback capacitor $C_F$ and the input resistor $R_{I3}$ as shown in FIG. 7 forms an analog integrator. Electrically coupling the non-inverting input 174 of the amplifier to the constant voltage $V_B$ introduces a bias of $V_B$ volts to the output 178. Thus, the output signal $V_{OUT}$ at the output terminal 178 is the integral of the voltage $V_J$ at the junction node 116, offset by a $V_B$ volts.

As shown in FIG. 7, the output 178 of the operational amplifier 170 is electrically coupled to junction node 116 through a feedback resistor 179. This connection causes the operational amplifier 170 to drive feedback current into, or remove current from, the junction node 116 when the output 178 of amplifier 170 is non-zero. The feedback current flowing into or out of the junction node 116 varies the average voltage $\overline{V}_J$ at node 116. When the average voltage $\overline{V}_J$ of the junction node 116 is $V_B$, the integral of the voltage $V_J$ offset by $V_B/2$, is zero. The operational amplifier 170 configured as an integrator supplying a feedback current to the junction node 116 thus functions to drive the junction node to $V_B$ volts, which is exactly ½ of the voltage across capacitors 104 and 106.

The feedback current from the operational amplifier output 178 creates a null balance condition in the inductor 102 that effectively creates a "zero gauss" condition within the inductor core, improving linearity and reducing the disturbing effect of the magnetic core in adjacent channels. The flux B canceled within the inductor is given by:

$$B = \mu H = \frac{\mu N i}{L},$$

where $\mu$ is the permeability of the flux path (effectively 1.0 in air), N is the number of turns of inductor windings, I is the inductor current in amperes, L is the length of the coil in meters and B is the magnetic field in Teslas.

The primary utility of the embodiment of the invention shown in FIG. 7 lies in the fact that the inductor current I flowing from capacitor 104 to capacitor 106 and vice versa can be many times the current supplied to the overall circuit via voltage source 114. The current supplied by the voltage source 114 needs to only be enough to replace energy lost due to lossy components in the inductor current path. The maximum field strength of the external field which can be detected by the invention is limited by the maximum current through the inductor. Thus, the higher the Q of the circuit (i.e., the more lossless the individual components), the greater the detectable external field strength for a given input supply current from voltage source 114.

Another significant utility of the present invention is its ability to drive multiple non-linear inductive loads simultaneously. For example, my co-pending U.S. patent application Ser. No. 09/315,205, filed on the same day as the present application, attorney docket number ADL-091, describes a pair of flux gate sensors electrically coupled in series opposition so as to reject magnetic fields that are common to both sensors. Many prior art systems handle such multiple inductive loads by sequentially driving each load separately then combining the results. Driving multiple loads simultaneously allows a more accurate measurement of magnetic fields, since the measurements made by the different sensors will be contemporaneous.

The invention may be embodied in other specific forms without departing from the spirit or essential characteristics thereof. The present embodiments are therefore to be considered in respects as illustrative and not restrictive, the scope of the invention being indicated by the appended claims rather than by the foregoing description, and all changes which come within the meaning and range of the equivalency of the claims are therefore intended to be embraced therein.

What is claimed is:

1. A system for cyclically driving an electrical current through a non-linear inductor in alternating directions so as to produce a substantially periodic current waveform, and for producing an output signal representative of said current waveform, comprising:

a capacitive node for storing electrical energy provided by a voltage source, said capacitive node being electrically coupled to said inductor;

a switching network electrically coupled to said capacitive node and said inductor, said switching network being operative, responsive to a controllers to alternately transfer said electrical energy from said capacitive node through said inductor in a first direction for a first time interval until said inductor saturates, and to said capacitive node through said inductor in a second direction until said inductor saturates;

a signal processor being electrically coupled to said capacitive node and said inductor, and producing said output signal, wherein said output signal is a predetermined function of said first time interval and said second time interval.

2. A system according to claim 1, wherein said inductor includes at least one flux gate sensor.

3. A system according to claim 1, wherein said inductor includes at least two fluxgate sensors electrically coupled in series opposition.

4. A system according to claim 1, wherein said switching network includes an output driver having a totem-pole output architecture electrically coupled between said voltage source and a system ground, and an output terminal electrically coupled to a terminal of said inductor.

5. A system for cyclically driving an electrical current through a non-linear inductor in alternating directions so as to produce a substantially periodic current waveform, and for producing an output signal representative of said current waveform, comprising:

a first capacitor and a second capacitor, said first capacitor being coupled between a voltage source and a junction node, said second capacitor being coupled between said junction and a system ground, a first terminal of said inductor being electrically coupled to said junction node, and said junction node producing a junction voltage;

a switching network for alternately interconnecting said first capacitor, said second capacitor and said inductor in a first state and a second state, said first state characterized by said inductor and said first capacitor being electrically coupled in parallel, and said second state characterized by said inductor and said second capacitor being electrically coupled in parallel;

a controller for configuring said switching network to said first state for a first time interval until said inductor saturates, thereupon configuring said switching network to said second state for a second time interval until said inductor saturates, such that said switching network cyclically alternates between said first state and said second state; and, a signal processor having an input terminal being electrically coupled to said junction so as to receive said junction voltage, and an output terminal producing said output signal, wherein said output signal is a predetermined function of said first time interval and said second time interval.

6. A system according to claim 5, wherein said inductor includes at least one flux gate sensor.

7. A system according to claim 5, wherein said inductor includes at least two fluxgate sensors electrically coupled in series opposition.

8. A system according to claim 5, wherein a value of said first capacitor, a value of said second capacitor and a non-saturated value of said inductor are selected such that said first capacitor, said second capacitor and said inductor are at resonance.

9. A system according to claim 5, wherein said switching network includes an output driver having a totem-pole output architecture electrically coupled between said voltage source and said system ground and an output terminal electrically coupled to a terminal of said inductor.

10. A system according to claim 9, said controller including a comparator having a non-inverting terminal, an inverting terminal, and said output driver, wherein a sense voltage representative of said electrical current is electrically coupled across said inverting terminal and said non-inverting terminal via an input network, and a feedback signal provided by said output driver is electrically coupled to said non-inverting input via a feedback network.

11. A system according to claim 10, wherein (I) said feedback network includes a hysteresis resistor electrically coupled between said output terminal and said non-inverting input terminal, (ii) a sense resistor is electrically coupled between said inductor and said junction so as to produce said sense voltage across said sense resistor, a first sense resistor terminal being electrically coupled to said inductor and a second sense resistor terminal electrically coupled to said junction, and (iii) said input network includes a first input resistor electrically coupled between said first sense resistor terminal and said inverting terminal, and a second input resistor electrically coupled between said second sense resistor terminal and said non-inverting terminal.

12. A system according to claim 5, further including a current source having an output terminal electrically coupled via a feedback network to said junction and providing a feedback current to said junction, a magnitude of said feedback current being a second predetermined function of said junction voltage, said first time interval and said second time interval.

13. A system according to claim 12, said current source including (I) an operational amplifier having an inverting input terminal, a non-inverting input terminal and an output terminal, (ii) a feedback capacitor electrically coupled between said inverting terminal and said output terminal so as to form an integrator circuit, (iii) an input resistor electrically coupled between said junction and said inverting terminal and (iv) a voltage reference electrically coupled to said non-inverting input.

14. A system according to claim 13, wherein said second voltage reference includes a resistive voltage divider electrically coupled between said voltage source and said system ground.

15. A system according to claim 12, wherein said feedback network includes a feedback resistor electrically coupled between said output terminal and said junction.

16. A system according to claim 5, said controller further including a sense element for sensing said inductor current so as to produce a current sense signal representative of said current magnitude, a comparator for comparing said current sense signal to a first saturation value while said inductor current flows in a first direction, and for comparing said current sense signal to a second saturation value while said electrical current flows in a second direction opposite to said first direction.

17. A method of cyclically driving an electrical current through an inductor in alternating directions so as to produce a substantially periodic current waveform, and for producing an output signal representative of said current waveform, including the steps of:

alternately interconnecting a first capacitor, a second capacitor and an inductor in a first state and a second state, said first capacitor and said second capacitor being electrically coupled in series at a junction node between a voltage source and a system ground, said first state characterized by said inductor and said first capacitor being electrically coupled in parallel, and said second state characterized by said inductor and said second capacitor being electrically coupled in parallel;

configuring said switching network to said first state for a first time interval until said inductor saturates, thereupon configuring said switching network to said second state for a second time interval until said inductor saturates, such that said switching network cyclically alternates between said first state and said second state; and, providing said output signal as a predetermined function of said first time interval and said second time interval.

* * * * *